United States Patent
Fetzer et al.

(10) Patent No.: US 11,335,822 B2
(45) Date of Patent: May 17, 2022

(54) MULTIJUNCTION SOLAR CELL HAVING PATTERNED EMITTER AND METHOD OF MAKING THE SOLAR CELL

(71) Applicant: The Boeing Company, Chicago, IL (US)

(72) Inventors: Christopher M. Fetzer, Valencia, CA (US); Peter Hebert, Glendale, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/817,349

(22) Filed: Mar. 12, 2020

(65) Prior Publication Data
US 2020/0212239 A1 Jul. 2, 2020

Related U.S. Application Data

(62) Division of application No. 15/374,377, filed on Dec. 9, 2016, now Pat. No. 10,593,818.

(51) Int. Cl.
*H01L 31/18* (2006.01)
*H01L 31/0352* (2006.01)
(Continued)

(52) U.S. Cl.
CPC .... *H01L 31/035236* (2013.01); *H01L 31/028* (2013.01); *H01L 31/0296* (2013.01);
(Continued)

(58) Field of Classification Search
CPC .......... H01L 31/1808; H01L 31/03529; H01L 31/02167; H01L 31/028; H01L 31/1804; H01L 31/1868
See application file for complete search history.

(56) References Cited

U.S. PATENT DOCUMENTS 6,380,601 B1 4/2002 Ermer et al.
10,312,134 B2 * 6/2019 Liu .................. H01L 21/02167
(Continued)

FOREIGN PATENT DOCUMENTS

EP 2999008 A2 3/2016
JP 2010-171374 A 8/2010
(Continued)

OTHER PUBLICATIONS

Communication Pursuant to Article 94(3) EPC dated Feb. 25, 2019, 6 pages.
(Continued)

*Primary Examiner* — Earl N Taylor
(74) *Attorney, Agent, or Firm* — MH2 Technology Law Group LLP (57) ABSTRACT

A multijunction solar cell includes a base substrate comprising a Group IV semiconductor and a dopant of a first carrier type. A patterned emitter is formed at a first surface of the base substrate. The patterned emitter comprises a plurality of well regions doped with a dopant of a second carrier type in the Group IV semiconductor. The base substrate including the patterned emitter form a first solar subcell. The multijunction solar cell further comprises an upper structure comprising one or more additional solar subcells over the first solar subcell. Methods of making a multijunction solar cell are also described.

24 Claims, 6 Drawing Sheets

(51) Int. Cl.
H01L 31/061 (2012.01)
H01L 31/078 (2012.01)
H01L 31/0216 (2014.01)
H01L 31/0224 (2006.01)
H01L 31/028 (2006.01)
H01L 31/0296 (2006.01)
H01L 31/0304 (2006.01)
H01L 31/032 (2006.01)
H01L 31/0725 (2012.01)
H01L 31/074 (2012.01)

(52) U.S. Cl.
CPC ............... H01L 31/02167 (2013.01); H01L 31/022425 (2013.01); H01L 31/0304 (2013.01); H01L 31/0322 (2013.01); H01L 31/03046 (2013.01); H01L 31/0352 (2013.01); H01L 31/03529 (2013.01); H01L 31/035209 (2013.01); H01L 31/061 (2013.01); H01L 31/074 (2013.01); H01L 31/078 (2013.01); H01L 31/0725 (2013.01); H01L 31/18 (2013.01); H01L 31/1804 (2013.01); H01L 31/184 (2013.01); H01L 31/1808 (2013.01); H01L 31/1868 (2013.01); Y02E 10/52 (2013.01); Y02E 10/547 (2013.01); Y02E 10/549 (2013.01); Y02P 70/50 (2015.11)

(56) References Cited

U.S. PATENT DOCUMENTS

| | | | | |
|---|---|---|---|---|
| 10,593,818 | B2* | 3/2020 | Fetzer | H01L 31/1808 |
| 2006/0021565 | A1* | 2/2006 | Zahler | H01L 31/03046 |
| | | | | 117/89 |
| 2006/0185582 | A1* | 8/2006 | Atwater | H01L 31/043 |
| | | | | 117/89 |
| 2008/0076203 | A1* | 3/2008 | Ribeyron | H01L 31/1864 |
| | | | | 438/72 |
| 2008/0211061 | A1* | 9/2008 | Atwater, Jr. | H01L 21/2007 |
| | | | | 257/615 |
| 2009/0004821 | A1* | 1/2009 | Shimomura | H01L 27/1214 |
| | | | | 438/458 |
| 2009/0246934 | A1* | 10/2009 | Yamazaki | H01L 21/76254 |
| | | | | 438/455 |
| 2010/0136718 | A1* | 6/2010 | Meisel | H01L 31/1804 |
| | | | | 438/16 |
| 2010/0167510 | A1* | 7/2010 | Kelman | H01L 21/2257 |
| | | | | 438/544 |
| 2010/0275990 | A1* | 11/2010 | Shimomura | H01L 31/1892 |
| | | | | 136/256 |
| 2012/0032148 | A1* | 2/2012 | Olson | H01L 31/0687 |
| | | | | 257/21 |
| 2012/0167973 | A1* | 7/2012 | Hu | H01L 31/035227 |
| | | | | 136/256 |
| 2012/0180854 | A1 | 7/2012 | Bellanger et al. | |
| 2013/0040421 | A1* | 2/2013 | Meisel | H01L 31/022425 |
| | | | | 438/98 |
| 2013/0105806 | A1* | 5/2013 | Liu | H01L 29/04 |
| | | | | 257/64 |
| 2013/0269777 | A1* | 10/2013 | Jin | H01L 31/02168 |
| | | | | 136/261 |
| 2014/0209149 | A1 | 7/2014 | Mascarenhas et al. | |
| 2014/0224313 | A1* | 8/2014 | Wu | H01L 31/0682 |
| | | | | 136/256 |
| 2014/0251817 | A1* | 9/2014 | Vais | H01L 31/1868 |
| | | | | 205/157 |
| 2014/0322906 | A1* | 10/2014 | Levy | H01L 21/223 |
| | | | | 438/549 |
| 2014/0326295 | A1* | 11/2014 | Moslehi | H01L 31/048 |
| | | | | 136/249 |
| 2014/0370650 | A1* | 12/2014 | Moslehi | H01L 31/18 |
| | | | | 438/98 |
| 2015/0053259 | A1 | 2/2015 | Hardin et al. | |
| 2015/0072467 | A1* | 3/2015 | Chan | H01L 31/0682 |
| | | | | 438/98 |
| 2015/0171240 | A1* | 6/2015 | Kapur | H01L 31/02167 |
| | | | | 438/72 |
| 2015/0236175 | A1* | 8/2015 | Kapur | H01L 31/1804 |
| | | | | 136/256 |
| 2015/0303348 | A1* | 10/2015 | Ha | H01L 31/068 |
| | | | | 438/98 |
| 2015/0325716 | A1* | 11/2015 | Baker-O'Neal | H01L 31/1864 |
| | | | | 136/256 |
| 2016/0049540 | A1* | 2/2016 | Kapur | H01L 31/068 |
| | | | | 136/256 |
| 2016/0190382 | A1* | 6/2016 | Kapur | H01L 31/061 |
| | | | | 438/96 |
| 2017/0025543 | A1* | 1/2017 | Kakehata | H01L 29/78606 |
| 2018/0166602 | A1* | 6/2018 | Fetzer | H01L 31/061 |
| 2020/0212239 | A1* | 7/2020 | Fetzer | H01L 31/1868 |

FOREIGN PATENT DOCUMENTS

| | | |
|---|---|---|
| JP | 2012-151471 A | 8/2012 |
| WO | WO2014/092677 A1 | 6/2014 |

OTHER PUBLICATIONS

Requisition by the Examiner and Examination Search Report dated Jan. 7, 2021 in corresponding Canadian Application No. 2986333, 12 pages.

Gudovskikh et al., "Interface properties of GaInP/Ge heterostructure sub-cells of multi-junction solar cells", J. Phys. D: Appl. Phys. 45 (2012), 7 pages.

Dunlap, Jr., "Diffusion of Impurities in Geirnanium", Physical Review, vol. 94, No. 6, Jun. 15, 1954, pp. 1531-1540.

Uzum et al., "Selective emitterformationprocessusingsinglescreen-printedphosphorus diffusion source", Solar Energy Materials & SolarCells 109(2013), pp. 288-293.

Green, Marin A., "High Efficiency Silicon Solar Cells", Trans Tech Publications 1987, pp. 72-73.

"The Basics of a Photovoltaic Solar Cell", http://teachers.usd497.org/agleue/Gratzel_solar_cell%20assets/Basics%20of%20a%20Photovoltaic%20%20Solar%20Cell.htm. pp. 1-11.

"Solar Cell" Wikepedia article, https://en.wikipedia.org/wiki/Solar_cell.

Extended European Search Report dated Mar. 6, 2018 in corresponding European Application No. 17205668.1, 9 pages.

Notice of Reasons for Rejection dated Dec. 7, 2021 in corresponding Japanese Patent Application No. 2017-234758, 10 pages.

* cited by examiner

FIG. 9

MULTIJUNCTION SOLAR CELL HAVING PATTERNED EMITTER AND METHOD OF MAKING THE SOLAR CELL

CROSS REFERENCE TO RELATED APPLICATIONS

This application is a divisional of and claims priority to U.S. patent application Ser. No. 15/374,377 filed Dec. 9, 2016 (now allowed), the disclosure of which is hereby incorporated herein by reference in its entirety.

DETAILED DESCRIPTION

Field of the Disclosure

The present disclosure is directed to a multijunction solar cell that employs a patterned emitter and a method of making the solar cell.

Background

Figure 1:
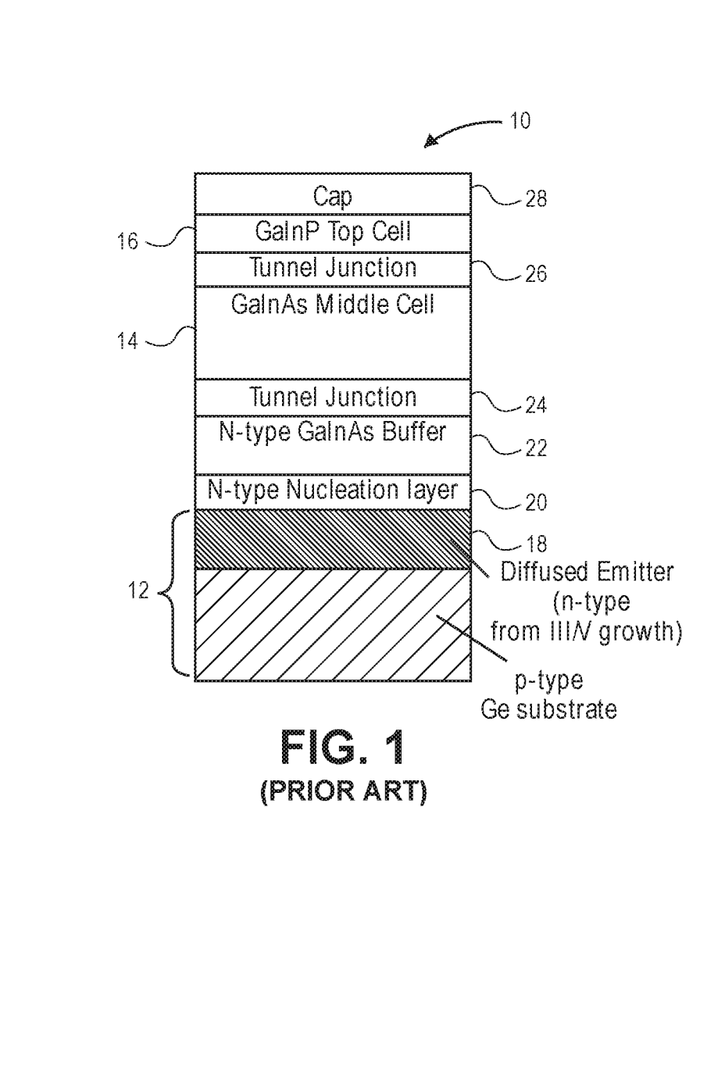
FIG. 1 shows a schematic cross-section of a conventional multijunction solar cell.

Improved solar cell efficiency is an ongoing aim of solar cell manufacturers. Providing multiple solar cell junctions in a single solar cell is a known method for increasing efficiency. Such multijunction solar cells can include a lower subcell formed in a germanium substrate. One or more additional junctions are formed over the lower subcell. FIG. 1 shows an example of one such conventional multijunction solar cell 10 having a p-type germanium substrate 12 with a diffused emitter region 18. A GaInAs middle subcell 14 and a GaInP top subcell 16 are formed as part of a monolithic semiconductor stack over the substrate 12. The middle subcell 14 and top subcell 16 include second and third junctions (not shown), which are in addition to the first junction provided by emitter region 18. An n-type nucleation layer 20, n-type GaInAs buffer layer 22, tunnel junctions 24, 26 and cap layer 28 are also positioned in the upper structure formed over the substrate 12. The n-type emitter 18 in the lowest subcell is formed by diffusion into the substrate 12 during III/V growth of the nucleation and/or buffer layers to form an unpatterned n-type layer of uniform thickness over the entire substrate surface. While the blanket diffusion process used to form the emitter provides a convenient method to fabricate the lower subcell, the emitter configuration provides a non-ideal pathway for losing photogenerated carriers, which reduces the efficiency of the solar cell.

There remains a need in the art for a multijunction solar cell having improved efficiency.

SUMMARY

The present disclosure is directed to a multijunction solar cell. The multijunction solar cell comprises a base substrate comprising a Group IV semiconductor and a dopant of a first carrier type. A patterned emitter is formed at a first surface of the base substrate. The patterned emitter comprises a plurality of well regions doped with a dopant of a second carrier type in the Group IV semiconductor. The base substrate including the patterned emitter form a first solar subcell. The multijunction solar cell further comprises an upper structure comprising one or more additional solar subcells over the first solar subcell.

The present disclosure is directed to a method of making a multijunction solar cell. The method comprises providing a base substrate comprising a Group IV semiconductor and a dopant of a first carrier type, the base substrate having a first major surface and a second major surface opposite the first major surface. A patterned emitter is formed at the first major surface of the base substrate. The patterned emitter comprises a plurality of well regions doped with a dopant of a second carrier type in the Group IV semiconductor. The base substrate including the patterned emitter form a first solar subcell. The method further comprises forming an upper structure comprising one or more additional solar subcells over the first solar subcell.

The present disclosure is also directed to a method of making a solar cell substrate. The method comprises providing a base substrate comprising a Group IV semiconductor and a dopant of a first carrier type, the base substrate having a first major surface and a second major surface opposite the first major surface. A patterned emitter is formed at the first major surface of the base substrate, the patterned emitter comprising a plurality of well regions doped with a dopant of a second carrier type in the Group IV semiconductor. The base substrate including the patterned emitter form a solar subcell. The method further comprises preparing the first major surface of the base substrate to receive an epitaxial layer.

The present disclosure is also directed to a solar cell substrate. The solar cell substrate comprises a base substrate comprising a Group IV semiconductor and a dopant of a first carrier type. The base substrate has a first major surface and a second major surface opposite the first major surface, the first major surface being epitaxially ready. A patterned emitter is formed at the first major surface of the base substrate. The patterned emitter comprises a plurality of well regions doped with a dopant of a second carrier type in the Group IV semiconductor. The base substrate includes the patterned emitter forming a first solar subcell.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates aspects of the present teachings and together with the description, serve to explain the principles of the present teachings.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

Figure 2:
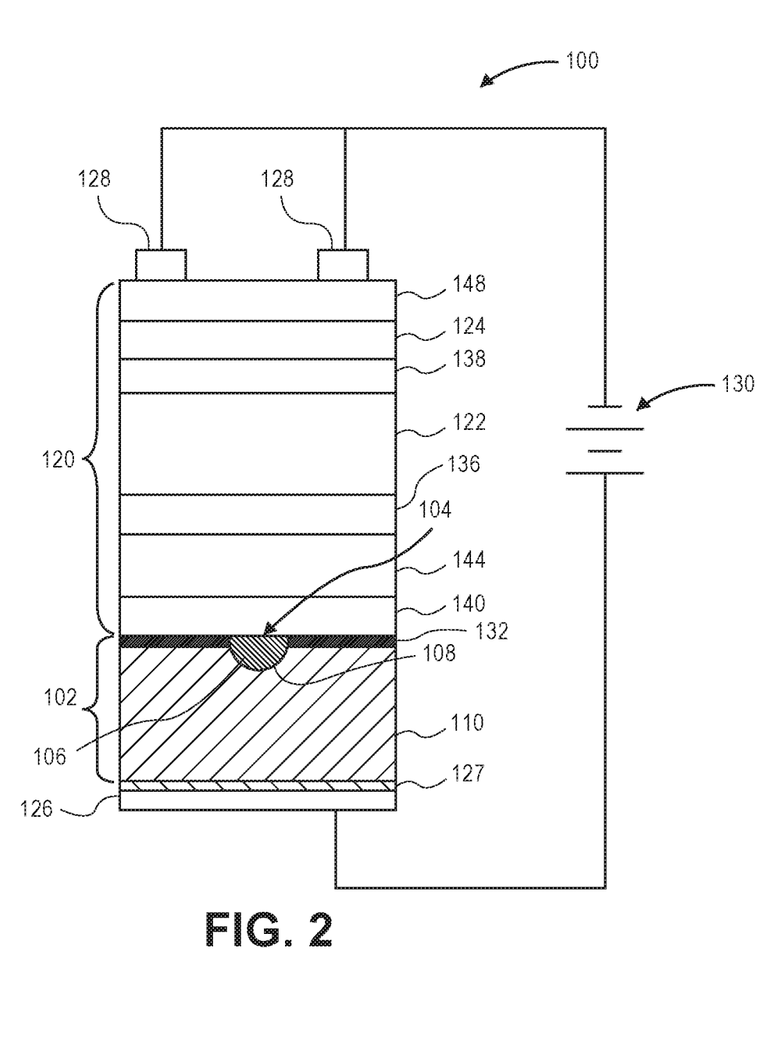
FIG. 2 illustrates a schematic cross-section of an example of a multijunction solar cell of the present disclosure.

FIG. 2 illustrates an example of a multijunction solar cell 100 of the present disclosure. The multijunction solar cell 100 comprises a base substrate 102 comprising a Group IV semiconductor and a background dopant of a first carrier type. A patterned emitter 104 is formed at a first surface of the base substrate 102. The term "patterned emitter" means that the doped well regions 106 of the emitter are selectively formed over only a portion of a surface of a first major surface of the base substrate 102, as opposed to forming a diffused doped region over the entire surface of the base substrate 102. As will be discussed in greater detail below, any pattern that will substantially reduce the total surface area that the emitter regions cover on the first major surface of the base substrate 102 can be employed. An optional passivation layer 132 is formed at the first surface of the base substrate 102. An upper structure 120 comprises one or more subcells 122,124 over the surface of base substrate 102 in which patterned emitter 104 is formed. A plurality of contacts 126,128 are positioned to connect the multijunction solar cell to a circuit 130. As examples, such circuits can be for supplying electricity to a solar powered device and/or charging a battery. Any desired circuit design can be employed and examples of suitable circuits that can be used in connection with solar cells of the present disclosure are well known in the art.

Base substrate 102 can comprise any suitable Group IV semiconductor material. Examples of Group IV semiconductors include a material chosen from germanium and silicon. Base substrate 102 is doped to provide a first subcell (sometimes referred to herein as a "first solar subcell") of the multijunction solar cell, as is described in detail below.

FIG. 2 shows a partial cross-sectional view of a single doped well region 106 of the patterned emitter 104 formed adjacent to background doped region 110 of the base substrate 102. Background doped region 110 is doped with a background dopant of a first carrier type. The patterned emitter 104 can comprise a plurality of such doped well regions 106, as shown by the schematic top view of FIG. 3. Each doped well region 106 is doped with a dopant of a second carrier type that is different than the background dopant having the first carrier type. The background dopant of the first carrier type and the dopant of the second carrier type are chosen so that the patterned emitter 104 forms a first pn junction, also referred to herein as a solar cell junction, 108 with the background doped region 110. For example, the background dopant of first carrier type can be a p-type dopant, in which case the dopant of the second carrier type used in patterned emitter 104 is an n-type dopant. Alternatively, the background dopant of the first carrier type can be an n-type dopant, in which case the dopant of the second carrier type is a p-type dopant. Minority carrier collection occurs through the pn junction, as illustrated by the arrows in base substrate 102 of FIG. 4.

Referring again to FIG. 3, the doped well regions 106 of patterned emitter 104 are illustrated as being positioned in an array of dots. The well regions of the present disclosure can be positioned in any suitable array or random pattern that will allow the desired collection of carriers during operation of the solar cell. Further, while the doped well regions 106 are shown as having a circular top surface, as seen from the overhead view of FIG. 3, any suitable top surface shape can be employed, including squares, rectangles, checkerboard pattern, lines, crossed lines (e.g., to form a grid) and so forth. The doped well regions 106 are shown as being separated by oppositely doped background doped region 110 and/or passivation layer 132, but could be connected. Thus, any pattern that will substantially reduce the total surface area that the emitter regions cover on the first major surface of the base substrate 102 can be employed. For example, the emitter regions can cover about 1% to about 50%, such as by about 5% to about 40%, or about 10% to about 30%, of the total surface area of the first major surface, where the first major surface is the major planar face of the base substrate in which the emitters are formed.

Figure 3:
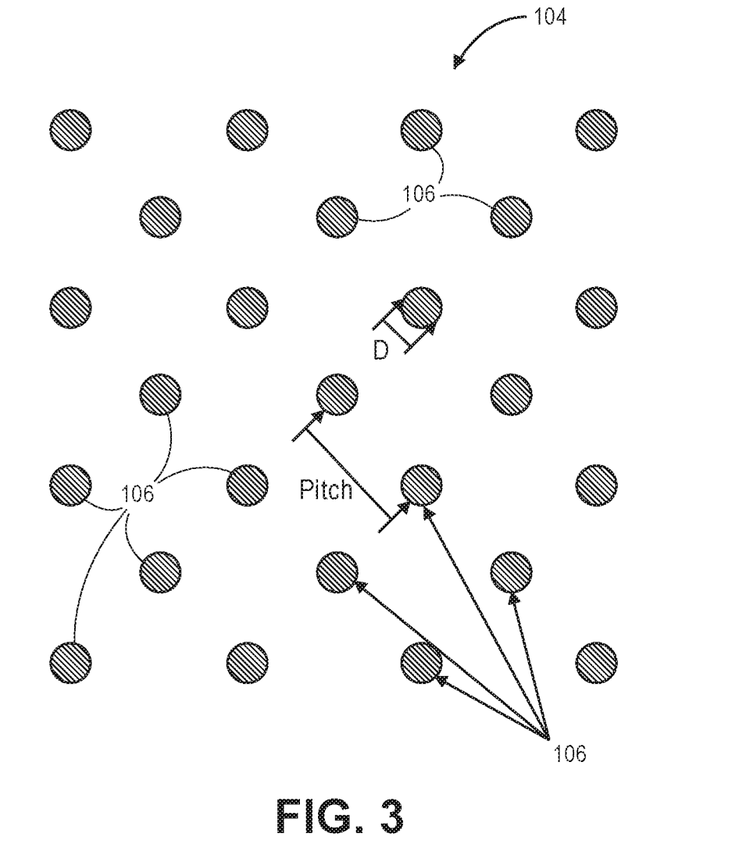
FIG. 3 illustrates a schematic top view of a patterned emitter of the present disclosure comprising a plurality of well regions.

The distance between adjacent doped well regions 106 can be chosen to be shorter than the diffusion length of the minority carriers in the base substrate 102, so that the generated carriers can reach the emitter. Referring to FIG. 3, the pitch, which is the shortest distance between two adjacent well regions, can range for example, from about 0.1 micron to about 1 mm, or about 1 micron to about 100 microns. For circular doped well regions, such as those in FIG. 3, the diameter, D, can have any suitable length that results in both the patterned emitter covering the desired total surface area of the base substrate and the doped well regions 106 being positioned to have the desired distance between adjacent well regions, as discussed above.

The doped well regions 106 are thicker than passivation layer 132 and extend sufficiently past the passivation layer 132 into the background doped region of base substrate 102 so as to allow the doped well regions 106 to function as an emitter, as shown in FIG. 2. Additionally, the concentration of dopant in doped well regions 106 is also higher than the concentration of dopant in the passivation layer 132. Here, the concentration of dopant in the well regions is higher than the concentration of dopant in the passivation layer, so the concentration in the passivation layer provides any necessary reference concentration for determining what concentrations are considered relatively "higher".

Employing patterned emitters, such as shown in FIGS. 2 and 3, can reduce the volume of the emitter as compared with a continuous layer emitter, which in turn allows for a reduction in Shockley-Read-Hall recombination type loss of the carriers generated during operation of the solar cell. All things being equal, reduced recombination loss of carriers results in improved solar cell efficiency. Thus, the dimensions of the emitter can be chosen to reduce emitter area and volume, thereby reducing recombination losses.

Referring again to FIG. 2, passivation layer 132 is a diffused region in base substrate 102 that is positioned between the doped well regions 106 of the patterned emitter 104 and comprises a dopant of the same carrier type as in the background dopant of base substrate 102. Any suitable dopant that provides the desired carrier type can be employed, such as any suitable n-type or p-type dopant. Optionally, if the layer to be formed on the base substrate 102 is a III-V material, the dopant can be one of the Group III or Group V elements of the III-V material itself. For example, if GaInAs is to be epitaxially grown on the III-V substrate, then either Ga, In or As can be diffused into the base substrate 102, depending on the desired carrier type to be used to form passivation layer 132.

The dopant concentration in passivation layer 132 can be higher than the concentration of background dopant in the base substrate 102, so as to produce a front surface field ("FSF") at the junction with the background doped region 110 (e.g., a p+/p junction if the background dopant is p-type, or an n+/n junction if the background dopant is n-type). The passivation layer 132 is optional. If employed, the passivation layer 132 can prevent or reduce minority carrier losses caused by interfacial recombination by producing the front-surface field at the base substrate surface.

The pn junction 108 forms the cell junction of the first subcell of the multijunction solar cell 100. At least one additional solar subcell is formed over the base substrate 102 as part of the upper structure 120. For example, upper structure 120 can include a middle subcell 122 and a top subcell 124. Any desired number of subcells can be formed in the upper structure 120, such as 1 to 10 subcells, or 2 to 6 subcells. Any suitable design, materials and techniques can be employed to form the additional subcell structures of upper structure 120. As an example, the one or more subcells 122, 124 can each comprise at least one pn junction formed in a semiconductor material. Suitable semiconductor materials can include a Group IV semiconductor, such as single crystal silicon, amorphous silicon, or a compound semiconductor material, such as a III/V or II/IV heteroepitaxial layers. Any suitable III/V heteroepitaxial materials can be employed, such as GaAs, GaInAs, or other materials. Any suitable II/IV heteroepitaxial materials can be employed, such as CdTe, CuInGaSe$_2$, or other II/IV materials. Techniques for depositing such layers are well known in the art and any suitable techniques can be employed. For example, the layers can be epitaxially grown on any of the Group IV base substrates (e.g., Si or Ge) described herein. Suitable dopants can be added to any of the layers to provide desired conductivity or other subcell junction properties, as is well known in the art.

One or more additional, optional layers can also be employed as part of the multijunction solar cell 100, including tunnel junction layers 136,138, nucleation layers 140, buffer layers 144, and cap layers 148. For example, tunnel junctions 136,138 can be formed in a III/V heteroepitaxial layer between the patterned emitter in the base substrate 102 and the one or more subcells in monolithic epitaxially grown structures, as shown in FIG. 2. Such tunnel junctions are well known and include a relatively heavily doped pn junction that is configured to allow electrons to tunnel between the subcells of a multijunction solar cell. Suitable techniques for forming tunnel junctions 136,138 are well known in the art.

Tunnel junction layers 136 and 138, nucleation layer 140 and buffer layer 144 can comprise any suitable semiconductor material, which can be the same or different material as that employed for the subcells 122, 124, with various different dopants and/or dopant concentrations within the different layers providing desired electrical properties. Suitable semiconductor materials can include Group IV semiconductors, such as single crystal silicon or germanium, or a compound semiconductor material, such as III/V or II/IV heteroepitaxial materials. Any suitable III/V heteroepitaxial materials can be employed, such as GaAs, GaInAs, or other III/V materials. Any suitable II/IV heteroepitaxial materials can be employed, such as CdTe, CuInGaSe$_2$, or other II/IV materials. Techniques for depositing such layers are well known in the art and any suitable techniques can be employed. For example, the layers can be epitaxially grown on any of the Group IV base substrates (e.g., Si or Ge) described herein. Suitable dopants can be added to any of the layers to provide for desired electrical conductivity or other properties, as is well known in the art.

The nucleation layer 140 can be epitaxially grown over the base substrate 102 to provide a suitable surface on which to grow subsequent epitaxial layers, such as buffer layer 144. The nucleation layer can have the same majority carrier type as the patterned emitter 104. One example of a nucleation layer is gallium indium phosphide, although any suitable nucleation layer can be employed. Other suitable nucleation layers are well known in the art.

The nucleation layer can have any desired thickness that will allow growth of the bulk heteroepitaxial layer thereon. Examples of suitable nucleation layer thickness can range from about 10 angstroms to about 500 angstroms, such as about 50 angstroms to about 200 angstroms, or about 70 angstroms to about 100 angstroms.

As shown in FIG. 2, buffer layer 144 can be positioned between the nucleation layer 140 and the middle subcell 122. Buffer layer 144 can be epitaxially grown on nucleation layer 140 and can have the same majority carrier type as the patterned emitter 104. Buffer layer 144 can comprise any Group IV semiconductor or compound semiconductor material taught herein. As an example, both the nucleation layer 140 and buffer layer 144 comprise Group III/V materials, such as GaAs, GaInAs, or other Group III/V materials that are doped as described herein to provide a desired conductivity. Techniques for epitaxially growing the buffer layer 144 are well known in the art. Any suitable epitaxial growth technique can be employed.

The growth conditions of the nucleation layer 140 and buffer layer 144 can be chosen to control diffusion of desired dopants, such as Ga, In, or As, into base substrate 102 during growth of these layer. In particular, when growth of a III/V material is employed to form the buffer layer 144, the nucleation layer can be selected to form a selective barrier to one of the Group III or Group V elements, while allowing the other element to diffuse through. Thus, the nucleation layer 140 can block diffusion of the Group V element, while the Group III element, which can function as a p-type dopant, is allowed to diffuse through the nucleation layer 140 and into the base substrate 102 to form the passivation layer 132. Alternatively, the nucleation layer can form a barrier to the Group III element, while the Group V element, which can function as an n-type dopant, is allowed to diffuse through the nucleation layer 140 and into the base substrate 102 to form the passivation layer 132. The nucleation layer and buffer layer growth conditions are selected so that the amount of dopant diffusion into the base substrate is not so high as to counter-dope the doped well region 106 and change the majority carrier type of the doped well region 106 (e.g., if the doped well region 106 is n-type, the p-type Group III dopant diffusion is small enough so as not to change the n-type emitter back to a p-type region, and vice versa). Selecting a suitable nucleation material to provide the desired control of diffusion of the Group III and/or Group V elements is within the ordinary skill in the art.

Figure 4:
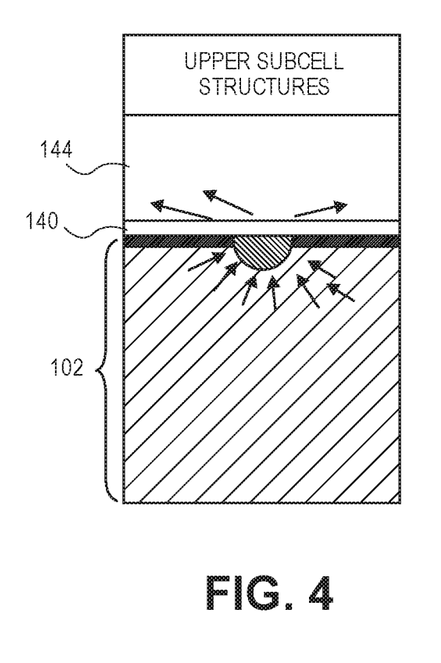
FIG. 4 illustrates a schematic view of lateral current collection and spreading current between the patterned emitter well regions in an example device of the present disclosure.

A limitation of solar cells having the patterned emitter configurations of the present disclosure is the potential for reduced lateral current collection and increased resistance of spreading current between the patterned emitter well regions, as illustrated by the arrows in FIG. 4. In order to ameliorate this potential problem, the nucleation layer 140 and/or buffer layer 144 can be doped at a sufficiently high dopant concentration to provide a desired level of lateral conductivity. The desired level of lateral conductivity will depend on a number of factors, such as the spacing between the patterned emitter, the particular design of the emitters and the application of the solar cell e.g. space solar cell vs concentrator solar cell. The increased conductivity (or decreased resistivity) in the layers above the patterned emitter can result in decreased resistance for lateral current flowing from the emitter to the subcells in upper structure 120, which can in turn reduce series resistance loss and increase efficiency of the solar cell. As an example, the nucleation layer 140 and/or buffer layer 144 can be doped with a sufficient concentration of dopant so that the lateral conductivity can be high enough such that the patterned emitter does not contribute significantly to the overall series resistance losses of the cell. The resistivity of the nucleation and/or buffer layers can range, for example, from about 0.1 m$\Omega$-cm to about 10,000 m$\Omega$-cm, such as about 0.5 m$\Omega$-cm to about 500 m$\Omega$-cm.

A cap layer 148 can be formed over the final subcell. The cap layer 148 serves the function of a transition between the metal and semiconductor. Cap layer 148 can be low resistance and provide an Ohmic contact (non-rectifying) between the metal and semiconductor. This reduces parasitic resistance losses or un-intentional diode behavior countering the diode of the solar cell, which can reduce the efficiency of the device. The cap layer 148 can also provide a location to mechanically attach contacts (external wires) to the semiconductor mediated by the metal layer. Such cap layers for use in solar cells are generally well known in the art.

Referring to FIG. 2, electrical rear contacts 126 and front contacts 128 can be deposited using any suitable technique. Further, any other configuration of positive and negative electrical contacts can be employed. For example, instead of front and rear contacts as shown in FIG. 2, both positive and negative contacts can potentially be formed on the front of the device, or both can be formed on the rear of the device, such as by etching contact vias to provide electrical contact to one or more layers within the device. Determining suitable techniques for forming such solar cell contacts is within the ordinary skill of the art.

In addition to or in place of electrical rear contacts 126, a reflectance layer can be formed proximate the base substrate 102. For example, a reflectance layer 127 can be deposited between the base substrate 102 and the rear electrode 126. In some instances, the rear contact 126 can comprise part of the reflectance layer. Suitable reflectance layers and methods for making such structures for solar cells are well known in the art. For example, in Si devices it is known to deposit a thin $Al_2O_3$ layer between the Silicon and the rear contact of the device. This acts as a reflective mirror on the back surface for light being emitted from the solar cell.

The buffer layer, tunnel junctions, subcells and optionally the nucleation layer of upper structure 120 can be a monolithic structure, meaning the layers are all formed as part of a single stack of subcells that share a set of electrical contacts. Alternatively, it is possible that each subcell of the multijunction solar cell stack can have its own set of contacts so as to form a tandom structure, as is generally well known in the art. In an example, the tandom solar cell structures do not employ a tunnel junction as part of the upper structure 120.

Figure 5:
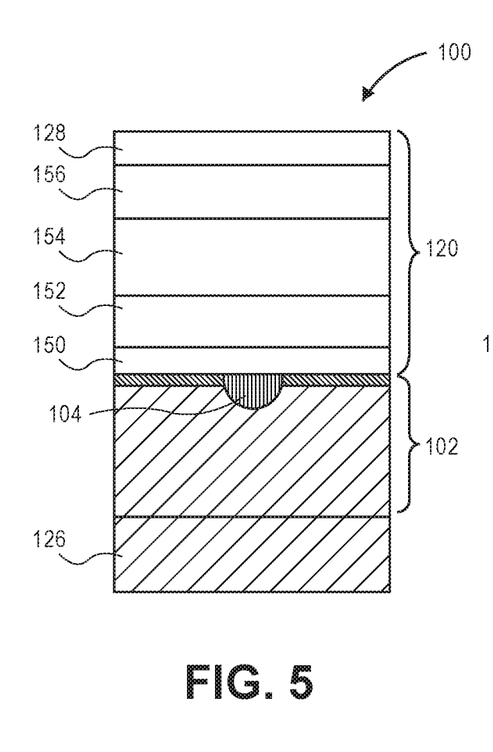
FIG. 5 illustrates a schematic cross-section of an example of an organic subcell that can be employed in multijunction solar cells of the present disclosure.

The upper structure 120 can also include one or more organic subcells. As an example, the one or more subcells each comprise a perovskite material. An example of an organic subcell is shown in FIG. 5, in which a conduction layer 150 is positioned between the base substrate 102 and the organic subcell. The base substrate 102, including the patterned emitter 104 and passivation layer 132, are as described above with reference to FIG. 2. In an example, the Group IV semiconductor material employed as base substrate 102 is single crystal silicon, such as n-doped or p-doped silicon, although single crystal germanium substrates can also be employed. The conduction layer 150 can comprise any suitably conductive material, including doped or intrinsically conductive materials. The material for conduction layer 150 can have a majority carrier type that is opposite to the majority carrier type of the base substrate 102 (e.g., if the background dopant is n-type in the base substrate 102 than the conduction layer 150 comprises a p-type material, and vice versa). Choosing suitable conductive materials for conduction layer 150 is within the ordinary skill of the art.

An organic hole transport medium ("HTM") 152 is positioned on conduction layer 150. An example of an organic hole transport medium is Spiro-OmeTAD, and any other suitable organic HTM can be employed. A semiconductive perovskite layer 154 is positioned on the hole transport medium 152. Any suitable semiconductive perovskite material can be employed, such as an organometallic halide perovskite material, for example, a methylamine lead iodide ("$MAPbI_3$"). A second conduction layer 156, which functions as an emitter, is positioned on the semiconductive perovskite layer 154. In general, conduction layer 146 can comprise any suitable conductive material, including either n-type or p-type materials. For example, second conduction layer 156 can comprise n-type conductive metal oxide materials such as indium tin oxide ("ITO"), aluminum tin oxide ("ATO", which is an ITO with added aluminum) or combinations thereof. The second conduction layer 156 has the same majority carrier type as the background dopant of the base substrate 102 (e.g., n-type if the background dopant is n-type or p-type if the background dopant is p-type). The second conductive layer 156 can optionally be transparent to visible light, as in the case where it comprises conductive metal oxides such as ITO or ATO. Front contact 128 can be positioned on the second conduction layer 156.

Figure 6:
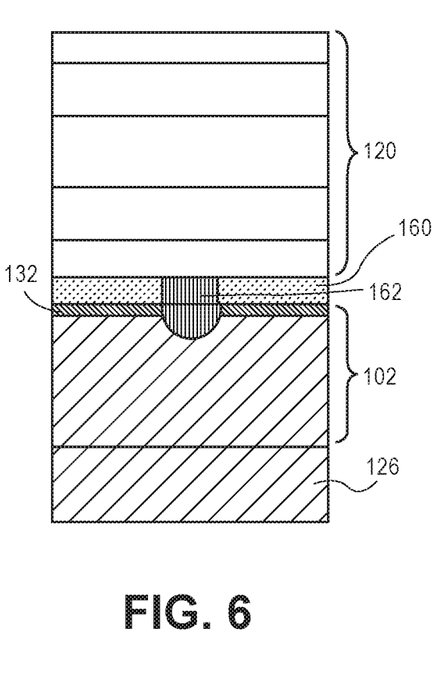
FIG. 6 illustrates a schematic cross-section of an example of an organic subcell that can be employed in multijunction solar cells of the present disclosure.

The multijunction solar cell 100 of FIG. 6 is similar to the solar cell of FIG. 5, except that the solar cell of FIG. 6 includes a second passivation layer 160 positioned between the base substrate 102 and the one or more subcells of upper structure 120. The second passivation layer 160 can generally be employed in the case of non-epitaxial upper junctions. For example, the second passivation layer 160 can be positioned directly on the first passivation layer 132 and on patterned emitter 104. Alternatively, the second passivation layer 160 can be used in place of the passivation layer 132. The second passivation layer 160 can help reduce or prevent recombination of carriers in the background doped regions of the base substrate 102, similar to the function of the passivation layer 132. The second passivation layer 160 can comprise any suitable electrically insulating material that is compatible with the multijunction solar cell 100. For example, the second passivation layer 160 can comprise an insulating material chosen from an oxide, such as aluminum oxide ($Al_2O_3$), sapphire, microcrystalline silicon or amorphous silicon. A conduction via 162 extends through the second passivation layer 160 to electrically connect each of a plurality of doped well regions 106 of the patterned emitter 104 to the one or more subcells.

Figure 9:
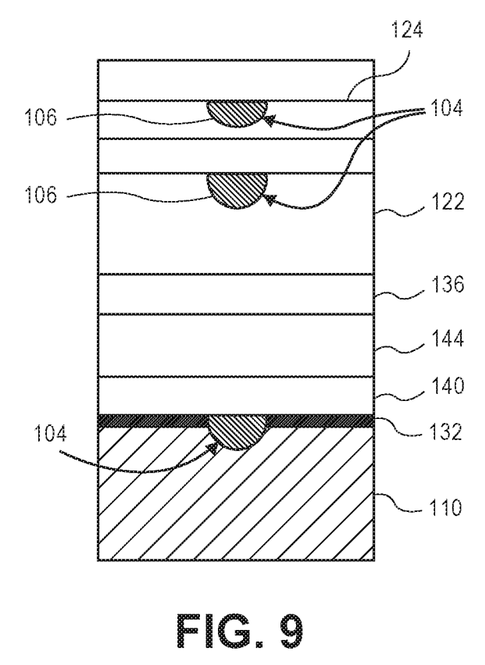
FIG. 9 illustrates a multijunction solar cell of the present disclosure comprising multiple patterned emitters.

While the patterned emitters 104 have been described herein as being formed in the lower subcell of base substrate 102, the idea is general and may be applied to any subcell within a stack. For example, patterned emitters 104 can be formed in epitaxially grown layers of subcells 122 and 124, as shown in FIG. 9. To form the emitters, the epitaxial process can be stopped at the desired position in the stack where the emitter is to be positioned and then the emitter can be patterned. After the emitter is formed, the epitaxial growth is continued to form the upper subcell in a multi-step epitaxial growth process. This process can be repeated each time an emitter is to be formed.

FIGS. 2 to 6 and 9 of the present disclosure show various device elements, including substrates, doped regions and layers of the multijunction solar cells of the present disclosure. Each of the device elements, including any substrate, doped region and/or layer, can be in direct contact with any other device element that is illustrated as being adjacent thereto in the figures. Alternatively, any two or more of the device elements that are illustrated as being adjacent one to another may not be in direct contact, but instead may have intervening device elements that are not illustrated formed therebetween. The terms "on" and "over" as used herein to describe the relationship between device elements are defined broadly to include intervening device elements, and therefore do not require direct physical contact or any particular spatial relationship (e.g., a layer positioned "over" or "on" a substrate can be positioned above, below or to the side of the substrate and one or more intervening layers may exist between the layer and the substrate). The phrases "directly on" or "in direct contact with" are defined to mean that there is direct physical contact.

Figure 7:
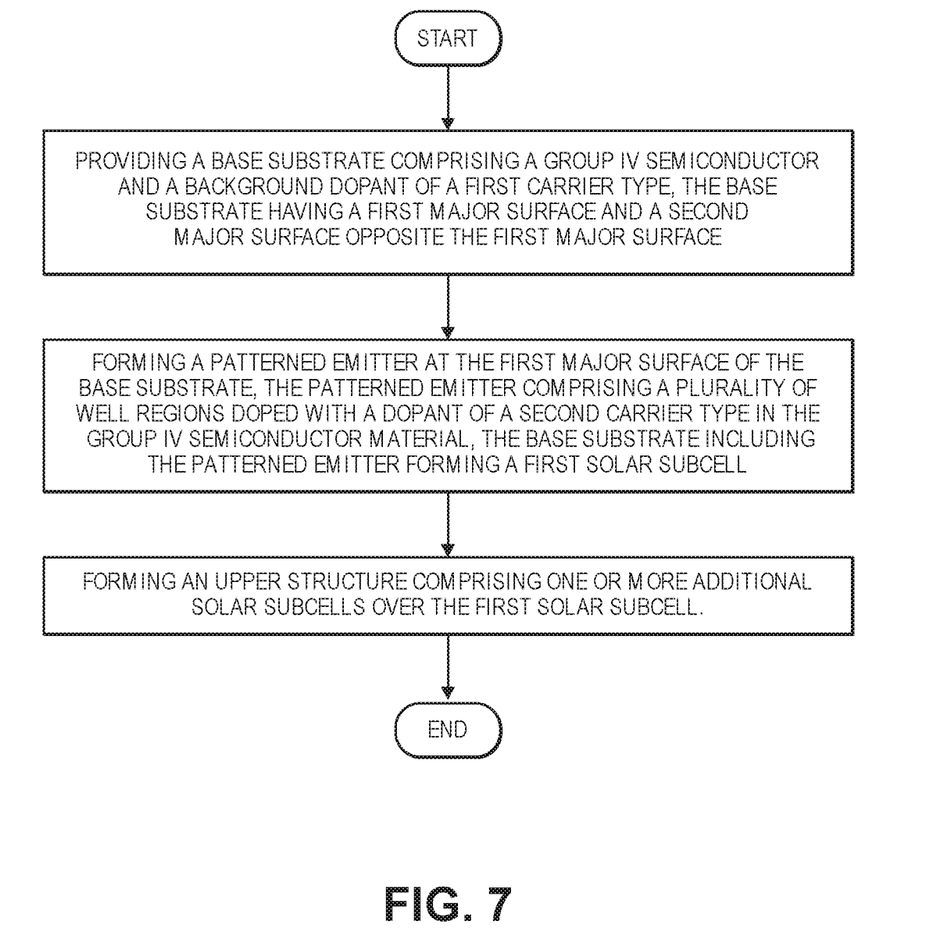
FIG. 7 illustrates a flow diagram of an example method of preparing a base substrate for multijunction solar cell fabrication.

As illustrated by the flow diagram of FIG. 7, the present disclosure is also directed to a method of preparing a base substrate 102 for multijunction solar cell fabrication. The method comprises providing an initial single crystal substrate comprising a Group IV semiconductor and a background dopant of a first carrier type. The substrate includes a first major surface and a second major surface opposite the first major surface. Such Group IV semiconductor substrates are well known and readily available in wafer form, for example. The surfaces of the substrate can optionally be prepared for processing by any desired methods, which may include cleaning the substrate, removal of native oxides and so forth.

A patterned emitter 104 is then formed at the first major surface of the substrate. Any suitable technique can be used to form the doped well regions 106 of patterned emitter 104. For example, dopant can be introduced to the base substrate 102 to form doped well regions 106 by masking and depositing dopant materials, by printing of dopant materials, or by ion implantation techniques. One or more annealing processes can be carried out to provide the desired diffusion of dopant either during or after introduction of the dopant to the base substrate. As one example of a doping technique, the base substrate 102 can be patterned with a mask layer, such as, for example, a protective oxide, nitride or photoresist. A plurality of the doped well regions 106 are then formed by introducing a dopant of a second carrier type in the Group IV semiconductor material of base substrate 102, such as by depositing and diffusing dopant in the regions of the substrate over which the mask layer is not formed. In another example, dopant paste (e.g., phosphorous doped paste) is screen printed onto the base substrate in a desired well region pattern, followed by annealing to diffuse the dopant from the paste into the substrate. Other suitable techniques, such as ink jet printing of nanoparticle containing inks that comprise dopant and/or laser induced diffusion techniques can be employed for forming the doped well regions. Such techniques are generally well known the art.

The first major surface of the substrate is then optionally prepared for formation of additional solar cell structures. For example, where additional subcells are to be formed in a single crystal III-V semiconductor stack deposited on the base substrate, the base substrate can be polished to an epitaxially ready condition using any suitable technique, such as chemical mechanical polishing. Alternatively, polishing can occur before formation of the patterned emitter 104. The polished substrate can then be chemically treated to clean the substrate and remove any native oxide from the surface comprising the patterned emitters. The prepared base substrate can then optionally be maintained in an epitaxially ready state by storing in an inert atmosphere to reduce growth of a native oxide thereon.

Processing of the base substrate can continue to form one or more additional solar cell device structures on the base substrate to complete fabrication of the multijunction solar cell. Alternatively, the base substrate can be provided to a third party solar cell manufacturer to complete fabrication of the multijunction solar cell.

The formation of passivation layer 132 can occur either before, during, or after deposition of the upper structure 120. The passivation layer 132 is a doped region in the Group IV semiconductor material of base substrate 102. Any suitable method for forming such a doped region can be employed. As an example, a p-type or n-type dopant can be diffused into base substrate 102 from the nucleation layer 140 and/or buffer layer 144 to form passivation layer 132. As described above, the dopant is the same dopant type (e.g., p-type or n-type) as is used as the background dopant for base substrate 102.

Figure 8:
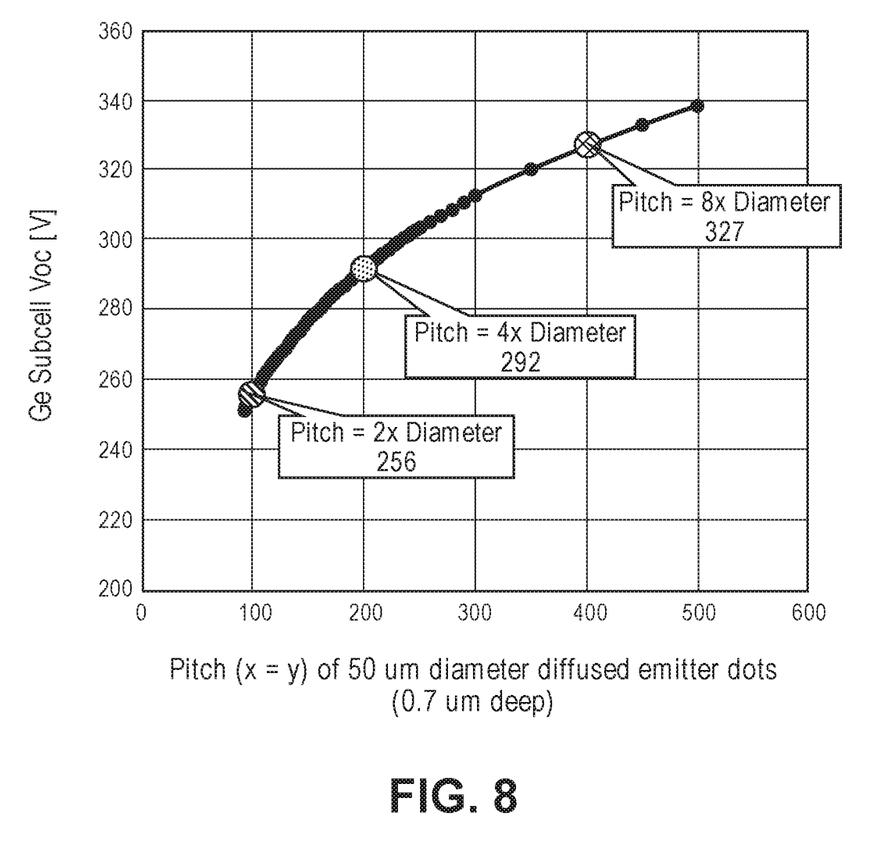
FIG. 8 is a graph of estimated voltage for a germanium subcell with an idealized reduced emitter contact under III/V multijunction solar cells, according to an example of the present disclosure.

FIG. 8 is a graph of estimated voltage for a germanium subcell with an idealized reduced emitter contact under III/V multijunction solar cells. The estimation is based on an emitter pattern similar to that shown in FIG. 3, where the emitters are circular dots that are 0.7 microns deep and have a diameter, D, of 50 microns. The pitch (distance between the center of adjacent dots) is varied from about 2 times the diameter to about 10 times the diameter. As can be seen from FIG. 8, as the pitch increases (indicating a reduced emitter volume) the subcell voltage (Voc) increases. It is believed that the reduced emitter volume causes a lower overall Shockley-Read-Hall recombination in the emitter, thereby increasing the subcell voltage. The increase in voltage assumes that the interfacial recombination velocity ("$S_o$") between the diffused regions is low (e.g., $S_o$ approaches 0 cm/s). The practical effect of this approach is to increase efficiency of converting sunlight to power, thereby making the solar cell more cost effective.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method of making a solar cell substrate, the method comprising:
   providing a base substrate comprising a Group IV semiconductor and a dopant of a first carrier type in a background doped region of the base substrate, the base substrate having a first major surface and a second major surface opposite the first major surface;
   forming a patterned emitter at the first major surface of the base substrate, the patterned emitter comprising a plurality of well regions doped with a dopant of a second carrier type in the Group IV semiconductor, the base substrate including the patterned emitter forming a solar subcell, the first surface of the base substrate including inter-well regions between the plurality of well regions, the inter-well regions comprising the Group IV semiconductor doped with a dopant of the first carrier type; and
   after forming the patterned emitter, preparing the first major surface of the base substrate to receive an epitaxial layer, the Group IV semiconductor being exposed to allow for epitaxial growth directly on both the well regions and the inter-well regions.

2. The method of claim 1, wherein preparing the first major surface of the base substrate to receive an epitaxial layer comprises:
   polishing the base substrate;
   chemically treating the base substrate after polishing; and
   storing the chemically treated base substrate in an inert atmosphere to reduce growth of a native oxide thereon.

3. The method of claim 1, wherein the base substrate comprises single crystal germanium.

4. The method of claim 1, further comprising providing the base substrate to a solar cell manufacturer for fabricating a solar cell.

5. The method of claim 1, wherein the plurality of well regions of the patterned emitter are positioned in an array.

6. The method of claim 1, wherein the plurality of well regions have a top surface shape chosen from circles, squares, rectangles, a checkerboard pattern, lines and crossed lines.

7. The method of claim 1, wherein the plurality of well regions have a circular top surface.

8. The method of claim 1, wherein the plurality of well regions cover about 1% to about 50% of the total surface area of the first major surface.

9. The method of claim 1, wherein the distance between adjacent well regions of the patterned emitter is chosen to be shorter than the diffusion length of minority carriers in the base substrate.

10. The method of claim 1, wherein a pitch is the shortest distance between the center of two adjacent well regions of the patterned emitter, the pitch ranging from about 0.1 micron to about 1 mm.

11. The method of claim 1, wherein the plurality of well regions are separated by the background doped region.

12. The method of claim 11, wherein the plurality of well regions are also separated by a passivation layer in the inter-well region of the first major surface of the base substrate, the passivation layer having a higher concentration of the dopant of the first carrier type than the background doped region, the plurality of well regions being thicker than the passivation layer and extending past the passivation layer into the background doped region.

13. The method of claim 1, further comprising epitaxially growing a nucleation layer over the base substrate.

14. A solar cell substrate, comprising:
   a base substrate comprising a Group IV semiconductor and a dopant of a first carrier type in a background doped region of the base substrate, the base substrate having a first major surface and a second major surface opposite the first major surface, the first major surface being prepared for epitaxial growth; and
   a patterned emitter formed at the first major surface of the base substrate, the patterned emitter comprising a plurality of well regions doped with a dopant of a second carrier type in the Group IV semiconductor, the base substrate including the patterned emitter forming a first solar subcell, the first surface of the base substrate including inter-well regions between the plurality of well regions, the inter-well regions comprising the Group IV semiconductor doped with a dopant of the first carrier type;
   wherein the Group IV semiconductor is exposed to allow for epitaxial growth directly on both the well regions and the inter-well regions.

15. The solar cell substrate of claim 14, wherein the base substrate comprises single crystal germanium.

16. The solar cell substrate of claim 14, wherein the plurality of well regions of the patterned emitter are positioned in an array.

17. The solar cell substrate of claim 14, wherein the plurality of well regions have a top surface shape chosen from circles, squares, rectangles, a checkerboard pattern, lines and crossed lines.

18. The solar cell substrate of claim 14, wherein the plurality of well regions have a circular top surface.

19. The solar cell substrate of claim 14, wherein the plurality of well regions cover about 1% to about 50% of the total surface area of the first major surface.

20. The solar cell substrate of claim 14, wherein the distance between adjacent well regions of the patterned emitter is chosen to be shorter than the diffusion length of minority carriers in the base substrate.

21. The solar cell substrate of claim 14, wherein a pitch is the shortest distance between the center of two adjacent well regions of the patterned emitter, the pitch ranging from about 0.1 micron to about 1 mm.

22. The solar cell substrate of claim 14, wherein the plurality of well regions are separated by the background doped region.

23. The solar cell substrate of claim 22, wherein the plurality of well regions are also separated by a passivation layer in the inter-well region of the first major surface of the base substrate, the passivation layer having a higher concentration of the dopant of the first carrier type than the background doped region, the plurality of well regions being thicker than the passivation layer and extending past the passivation layer into the background doped region.

24. The solar cell substrate of claim 14, further comprising an epitaxially grown nucleation layer over the base substrate.

* * * * *